United States Patent
Arnborg

(10) Patent No.: US 8,183,918 B2
(45) Date of Patent: May 22, 2012

(54) CIRCUITRY AND METHOD FOR REDUCING SECOND AND THIRD-ORDER NONLINEARITIES

(75) Inventor: Torkel Arnborg, Stockholm (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 48 days.

(21) Appl. No.: 12/594,655

(22) PCT Filed: Mar. 25, 2008

(86) PCT No.: PCT/EP2008/053479
§ 371 (c)(1), (2), (4) Date: Mar. 25, 2010

(87) PCT Pub. No.: WO2008/122506
PCT Pub. Date: Oct. 16, 2008

(65) Prior Publication Data
US 2010/0194449 A1    Aug. 5, 2010

Related U.S. Application Data

(60) Provisional application No. 60/911,389, filed on Apr. 12, 2007.

(30) Foreign Application Priority Data

Apr. 4, 2007    (EP) ..................... 07105605

(51) Int. Cl.
*H03F 3/45* (2006.01)
*H03F 3/16* (2006.01)
(52) U.S. Cl. ..................... 330/253; 330/261
(58) Field of Classification Search ............ 330/149, 330/253, 277, 261
See application file for complete search history.

(56) References Cited

U.S. PATENT DOCUMENTS

| | | | | |
|---|---|---|---|---|
| 5,119,392 A | * | 6/1992 | Childs | 372/38.08 |
| 5,376,898 A | * | 12/1994 | Tanaka et al. | 330/253 |
| 6,614,301 B2 | * | 9/2003 | Casper et al. | 330/253 |
| 2002/0113650 A1 | | 8/2002 | Kim et al. | |
| 2007/0287404 A1 | | 12/2007 | Arnborg | |

FOREIGN PATENT DOCUMENTS
WO    WO 2005/078920 A    8/2005

OTHER PUBLICATIONS

Brinkhoff J et al: "Baseband Impedance and Linearization of FET Circuits" IEEE Transactions on Microwave Theory and Techniques, IEEE Service Center, Piscataway, NJ, US vol. 51, No. 12, Dec. 2003, pp. 2523-2530, XP011105017 ISSN: 0018-9480 the whole document.

* cited by examiner

*Primary Examiner* — Steven J Mottola

(57) ABSTRACT

An electronic circuit comprises at least two transistors coupled in parallel, wherein the second transistor channel length is configured such that the threshold voltage of the second transistor is at a peak on a threshold voltage versus channel lengths curve arising from reverse short channel effects for a given semiconductor process. The first transistor is biased with a first gate-source voltage and a first drain-source voltage. The second transistor is biased with a second gate-source voltage and a second drain-source voltage. The first and second gate-source voltages are offset from each other by a gate-source voltage offset. The first and second drain-source voltages are offset from each other by a drain-source voltage offset. These bias conditions result in the transistors operating in different regions so that the second and third-order nonlinearities of the transistors substantially cancel each other out simultaneously.

13 Claims, 12 Drawing Sheets

CIRCUITRY AND METHOD FOR REDUCING SECOND AND THIRD-ORDER NONLINEARITIES

This application claims the benefit of U.S. Provisional Application No. 60/911,389, filed Apr. 12, 2007, the disclosure of which is fully incorporated herein by reference.

TECHNICAL FIELD

The present invention generally relates to electronic circuits and particularly to reducing second and third-order nonlinearities of transistor devices in the electronic circuits.

BACKGROUND

Linear signal amplification represents a core enabling function in most communication circuits. For example, wireless communication transceivers employ linear signal amplification at various stages in their transmit and receive signal processing paths. More particularly, radiofrequency (RF) based communication systems rely on linear amplification in frequency mixing circuits, low-noise amplification circuits, power amplification circuits, and the like, to maintain signal fidelity and to limit the generation of unwanted harmonic frequencies. However, the non-linear current-voltage (IV) behavior of semiconductor transistors, such as bipolar or MOS transistors, represents a fundamental source of signal non-linearity in communication circuits, which rely heavily on the use of such transistors.

Important transistor-related parameters for most analog RF building blocks include transconductance, noise, and output conductance. In particular, transistor transconductance ($g_m$), a derivative of the drain-source/collector current with respect to the gate-source/base-emitter voltage, represents a fundamental measure of transistor linearity. The first derivative of the drain-source/collector current with respect to the gate-source/base-emitter voltage ($g_{m1}$) represents the linear coefficient of the transistors. The second and third derivatives of the drain-source/collector current with respect to the gate-source/base-emitter voltage ($g_{m2}$ and $g_{m3}$) represent respectively the second and third-order nonlinearity coefficients of the transistors. The nonlinearity coefficients $g_{m2}$ and $g_{m3}$ affect $2^{nd}$ and $3^{rd}$-order inter-modulation distortion (IMD2 and IMD3) which in turn affect the $2^{nd}$ and $3^{rd}$-order intercept points (IP2 and IP3). Higher IP2 and IP3, that is higher linearity of the circuit, require $g_{m2}$ and $g_{m3}$ to be zero or close to zero.

Heterodyne and homodyne are two typical receiver architectures in wireless communication transceivers. The homodyne receiver has taken over today in the highly integrated circuit (IC) implementations. It turns out that in general these two receivers are sensitive to different types of nonlinear distortion. The second-order nonlinearity in transistors generates second-order distortion signals which can be difficult to distinguish from the desired signal in the homodyne receiver. Similar arguments can be made for the heterodyne receiver which has high requirements on the third-order nonlinear distortion. For modern radio transceivers in general, especially those handling multi-standards, there are requirements on both second and third-order nonlinearities since there are signals with different frequencies present at the receiver and different frequency combinations occur. It is thus of interest to reduce both $2^{nd}$ and $3^{rd}$ order nonlinear distortion at the same time.

There are many different linearization techniques, such as feedback, pre-distortion and poly-phase filtering which may be used in order to compensate for transistor device nonlinearity. More fundamental nonlinearity compensation mechanisms exist apart from or in conjunction with these compensation techniques. For example, a more linear composite transistor device can be formed by placing two or more transistors in parallel, such as in U.S. Pat. No. 6,636,115; U.S. Pat. No. 6,819,184 and Chunyu Xin et al "a Linearization Technique for RF Low Noise Amplifier", paper from IEEE International Symposium on Circuit And Systems 2004, techniques are exploited for nonlinearity cancellation of a transistor pair by different gate/base biasing and properly sizing the transistors. However the cancellation only applies for the third-order or odd-order nonlinearity. Chunyu Xin et al state in "a Linearization Technique for RF Low Noise Amplifier" that the second-order nonlinearity usually gets worse for the best third-order distortion cancellation bias point. This is due to the fact that for different gate bias, although the $3^{rd}$-order coefficients of the two transistors can have different signs, they can be cancelled out by combining the current, the 2nd-order coefficients, however will have the same sign. By adding the output currents of the transistor pair, the $2^{nd}$-order term will be added so it deteriorates the second-order intercept point IP2. In order to keep IP2 performance and at the same time provide third-order compensation, a differential circuit with matched transistors is used so that the 2nd-order distortion can be cancelled. However, differential circuits are complicated and have high current consumption, and in addition require perfectly matched transistors.

U.S. patent publication No. 2005/0176399 presents an amplifier which comprises a source degeneration inductance and at least two field effect transistors coupled in parallel and having mutually different gate biasing. Source connections of the field effect transistors are coupled along different positions of the source degeneration inductance. This technique is used to reduce the contribution of the second-order nonlinearity to the third-order intermodulation distortion for high frequencies when the composite transistor is biased for optimum third-order nonlinearity cancellation. The cancellation of second-order nonlinearity itself is not discussed.

Therefore there is a need to exploit a method and circuitry that can cancel both $2^{nd}$ and $3^{rd}$-order nonlinearities at the same time, that is to say, to improve IP2 and IP3 simultaneously.

SUMMARY

An electronic circuit comprises at least two transistors coupled in parallel. The first transistor is biased with a first gate-source voltage and a first drain-source voltage. The second transistor is biased with a second gate-source voltage and a second drain-source voltage. The first gate-source voltage and the second gate-source voltage are offset from each other by a gate-source voltage offset and the first drain-source voltage and the second drain-source voltage are offset from each other by a drain-source voltage offset. These bias conditions result in the first and second transistors operating in different regions so that the second and third-order nonlinearities of the first and second transistors substantially cancel each other out simultaneously.

In one embodiment, the first transistor may be operated in a quadratic saturated region or linear non-saturated region; the second transistor may be operated in an exponential sub-threshold region or quasi-exponential region. The gate-source offset voltage and the drain-source offset voltage are determined such that a ratio of a second derivative and third derivative of a drain-source current of the first transistor with respect to the first gate-source voltage is about equal to a ratio of a second derivative and third derivative of a drain-source current of the second transistor with respect to the second gate-source voltage.

A corresponding method of implementing an electronic circuit comprises coupling in parallel at least two transistors. This method includes biasing the first and second transistors so that they are operating in different regions. This results a ratio of a second derivative and third derivative of a drain-source current of the first transistor with respect to the first gate-source voltage is about equal to a ratio of a second derivative and third derivative of a drain-source current of the second transistor with respect to the second gate-source voltage such that the second and third-order nonlinearities of the first and second transistors substantially cancel each other out simultaneously.

As non-limiting examples, the electronic circuit offers the advantage of reduced nonlinearities on both second and third-order. The improved linearity and good manufacturability of the electronic circuit make it an ideal building block in a wide range of circuit applications, such as low-noise amplifiers, RF mixers, power amplifiers etc.

Of course, the present invention is not limited to the above features and advantages. Indeed, those skilled in the art will recognize additional features and advantages upon reading the following detailed description, and upon viewing the accompanying drawings.

DETAILED DESCRIPTION

In operation, the transistors' transconductances are not only dependent on gate-source voltage but also on drain-source voltage, as are the second and third-order nonlinearities. In addition, transistor's size and threshold voltage are also two important parameters to be considered when dealing with transistor nonlinearities. With these terms in mind, a circuit and method to cancel the second and third-order nonlinearities are described as following.

Figure 1:
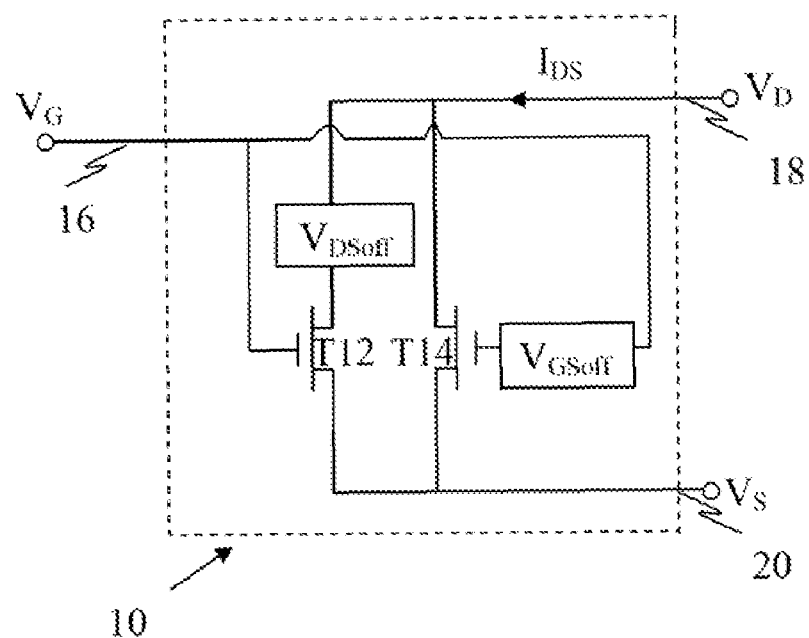
FIG. 1 is a block diagram of one embodiment of a transistor circuit.
Figure 2:
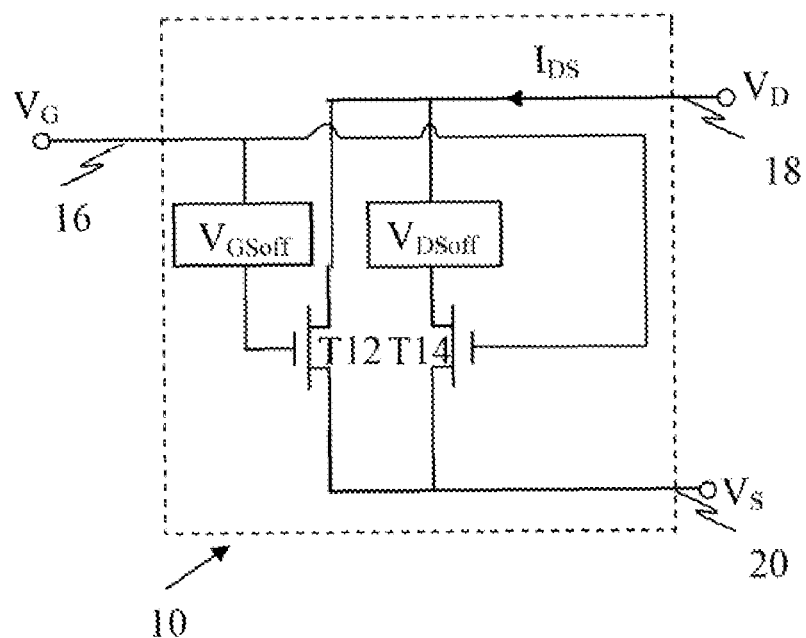
FIG. 2 is a block diagram of another embodiment of a transistor circuit.

FIG. 1 illustrates a "composite" transistor circuit 10, formed by coupling a first transistor T12 in parallel with a second transistor T14, such that the two transistors T12 and T14 share a gate connection 16, a drain connection 18, and a source connection 20. (For bipolar implementations of the transistor circuit 10, these connections correspond to base, collector, and emitter connections, respectively.) The gate bias of transistor T14 is offset by $V_{GSoff}$ from the gate bias of the transistor T12. The drain bias of the transistor T12 is offset by $V_{DSoff}$ from the drain bias of the transistor T14. In this way, the transistors T12 and T14 have different gate and drain biases. Notice that the offset voltages $V_{GSoff}$ and $V_{DSoff}$ are relative, they can be added to the gate of T12 and the drain of T14 respectively as shown in FIG. 2. Further, the transistors T12 and T14 may have different threshold voltages, widths and lengths.

Note that the transistor circuit 10 is, in one or more embodiments, implemented in an integrated circuit process, wherein the first transistor T12 comprises more than one integrated circuit transistor element configured with a first transistor channel length, and the second transistor T14 comprises more than one integrated circuit transistor element configured with a second transistor channel length.

The drain-source current of a transistor can be expressed by polynomial approximation of gate-source voltage (when neglecting the dependence on drain-source voltage) with derivatives of drain-source current being coefficients of terms in a polynomial according to:

$$I_{DS} = I_{DC} + \frac{\partial I_{DS}}{\partial V_{gs}} V_{gs} + \frac{\partial^2 I_{DS}}{\partial V_{gs}^2} V_{gs}^2 + \frac{\partial^3 I_{DS}}{\partial V_{gs}^3} V_{gs}^3 + \ldots \qquad \text{Eq. 1}$$

$$= I_{DC} + g_{m1} V_{gs} + g_{m2} V_{gs}^2 + g_{m3} V_{gs}^3 + \ldots$$

As previously noted, $g_{m1}$ represents the first derivative of the drain-source current with respect to the gate-source voltage, which is the transistor transconductance. $g_{m2}$ and $g_3$ represent the second and third-order derivative of the drain-source current with respect to the gate-source voltage respectively, that is to say, the first and second derivative of the transconductance respectively.

With the above, one sees that the transconductance is a measure of transistor linearity. Higher linearity is achieved by making the transconductance vary less with the applied gate bias, that is to say $g_{m1}$ is constant over gate bias so that $g_{m2}$ and $g_{m3}$ are zero or close to zero.

For the transistor circuit 10, the combined drain-source current is:

$$I_{DS} = I_{DS12} + I_{DS14}$$

The combined drain-source current is linear if $g_{m2}$ of the transistors T12 and T14 cancel each other out and $g_{m3}$ of the transistors T12 and T14 cancel each other out simultaneously. Proper biasing of the transistors T12 and T14 so that they operate in different regions will result in that $g_{m2}$ and $g_{m3}$ have approximately the same values but different signs for the transistors T12 and T14. The following description and equations will show the principle of cancelling and how to find such bias points.

A Metal Oxide Semiconductor (MOS) transistor may be modeled in four different operating regions depending on the gate-source ($V_{GS}$) and drain-source ($V_{DS}$) bias voltages. These four operating regions are: exponential sub-threshold region, quasi-exponential region, quadratic saturated region and linear non-saturated region. An approximation according to Eq. 2 can fit very well for both the quadratic saturated and linear non-saturated region, when the gate-source voltage of the MOS transistor is above its threshold voltage:

$$I_{DS} = K\frac{(V_{GS} - V_1)^\alpha}{(V_{GS} - V_2)^\gamma} \text{ when } V_{GS} > V_t \qquad \text{Eq. 2}$$

The constants in Eq. 2 are related to physical quantities according to:

$$K \propto \frac{WC_{ox}\mu_0}{L}$$

$$V_1 = V_t$$

$$V_2 = V_0 - V_m$$

where $C_{ox}$ the capacitance (per unit area) of the oxide layer separating the gate from the channel, W is the channel width, L is the channel length, $\mu_0$ is the mobility of the electrons/holes in the channel, $V_{GS}$ is the gate-source voltage and $V_t$ is the threshold voltage. The constants $V_m$ and $V_0$ are defined by the semiconductor process. They control the on-set of mobility degradation due to surface scattering. The numerator in Eq. 2 is related to potential distribution in the channel. The exponent $\alpha$ can have values 1 or 2 depending on whether the transistor is operating in the saturated or non-saturated region. The denominator is related to surface scattering. The exponent $\gamma$ can be 1 or 2 or between 1 and 2 depending on whether the transistor is dominated by hole or electron transport. For the nonlinear cancellation analysis carried on in this application, $\alpha = \gamma = 2$ will fit well.

When the gate-source voltage of a MOS transistor is below or around the threshold voltage, then the transistor operates in the exponential sub-threshold region where its drain-source current can be expressed as in Eq. 3 (the drain bias voltage dependence is very small and neglected):

$$I_{DS} = I_{DS0}e^{m\beta(V_{GS}-V_t)}, \text{ when } V_{GS} \leq V_t \qquad \text{Eq. 3}$$

where m is an ideality factor of the exponential function that is always <1. $\beta$ is the inverse thermal voltage q/kT, $I_{DS0}$ is the saturation current.

In one embodiment, the transistor T12 is biased in the operating condition as expressed by Eq. 2 and T14 is biased in the exponential sub-threshold region as expressed by Eq. 3. In a strict sense the transistor 12 operates in the linear non-saturated region since $V_{gs}-V_t > V_{ds}$ but second order effects like drain induced barrier lowering, channel length modulation and velocity saturation can make the transition between the operating regions less visible and obvious.

From Eq. 2 and 3, one can calculate the first, second and third derivatives as follows:

For the transistor T14 operating in the exponential sub-threshold region:

$$g_{m1\_14} = m\beta I_{DS0\_14} e^{m\mu(V_{GS14}-V_{t14})} = m\beta I_{DS14} \qquad \text{Eq. 4}$$

$$g_{m2\_14} = (m\beta)^2 I_{DS14} \qquad \text{Eq. 5}$$

$$g_{m3\_14} = (m\beta)^3 I_{DS14} \qquad \text{Eq. 6}$$

A ratio of the second and third derivative of the transistor T14 is:

$$\frac{g_{m2\_14}}{g_{m3\_14}} = \frac{1}{m\beta} \qquad \text{Eq. 7}$$

For the transistor T12 operating in the quadratic saturated or linear non-saturated region, the following applies:

$$g_{m1\_12} = 2K(V_1 - V_2)\frac{(V_{GS12} - V_1)}{(V_{GS12} - V_2)^3} \qquad \text{Eq. 8}$$

$$g_{m2\_12} = -2K(V_1 - V_2)\frac{(2V_{GS12} + V_2 - 3V_1)}{(V_{GS12} - V_2)^4} \qquad \text{Eq. 9}$$

$$g_{m3\_12} = 12K(V_1 - V_2)\frac{(V_{GS12} + V_2 - 2V_1)}{(V_{GS12} - V_2)^5} \qquad \text{Eq. 10}$$

A ratio of the second and third derivative of the transistor T14 is:

$$\frac{g_{m2\_12}}{g_{m3\_12}} = -\frac{(2V_{GS12} + V_2 - 3V_1)(V_{GS12} - V_2)}{6(V_{GS12} + V_2 - 2V_1)} \qquad \text{Eq. 11}$$

It may be noticed that the second and third derivatives of the drain-source current respective to the gate-source voltage for T14 are always positive. To find the gate bias voltage which achieves cancellation for both the second and third-order nonlinearities, one needs to solve Eq. 12:

$$\begin{cases} 2K(V_1 - V_2)\frac{(2V_{GS12} + V_2 - 3V_1)}{(V_{GS12} - V_2)^4} = (m\beta)^2 I_{DS14} \\ 12K(V_1 - V_2)\frac{(V_{GS12} + V_2 - 2V_1)}{(V_{GS12} - V_2)^5} = (m\beta)^3 I_{DS14} \end{cases} \qquad \text{Eq. 12}$$

By dividing the two above equations with each other, one obtains Eq. 13:

$$\frac{(2V_{GS12} + V_2 - 3V_1)(V_{GS12} - V_2)}{6(V_{GS12} + V_2 - 2V_1)} = \frac{1}{m\beta} \qquad \text{Eq. 13}$$

From Eq. 13, a condition for simultaneous cancellation of the second and third-order nonlinearities is found:

$$V_{GS12can} = \qquad \text{Eq. 14}$$

$$\frac{V_2 + 3V_1 - \frac{6}{m\beta}}{4} \pm \sqrt{\left(\frac{V_2 + 3V_1 - \frac{6}{m\beta}}{4}\right)^2 - \frac{6}{m\beta}(V_2 - 2V_1)}$$

where, $V_{GS12can}$ is the gate bias for the transistor T12. This gate bias have two solutions, the one corresponding to the minus sign in front of the square root is rejected. When $V_{GS12can}$ is found, the gate bias for T14 is offset by $V_{GSoff}$ from $V_{GS12can}$. The $V_{GSoff}$ value may be calculated from Eq. 15:

$$2K(V_1 - V_2)\frac{(2V_{GS12can} + V_2 - 3V_1)}{(V_{GS12can} - V_2)^4} = \qquad \text{Eq. 15}$$
$$(m\beta)^2 I_{DS0} e^{\beta m(V_{GS12can} + V_{GSoff} - Vt)}$$

Figure 3:
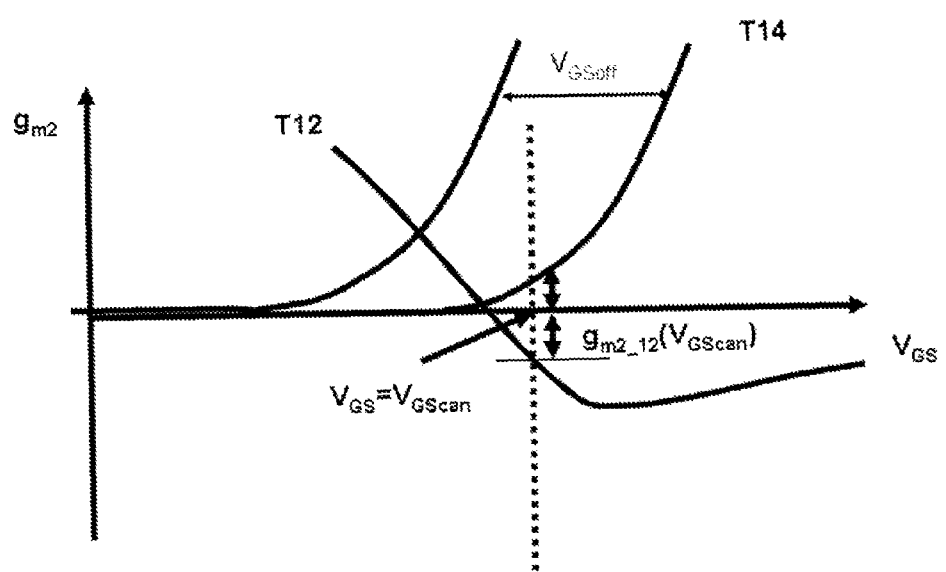
FIG. 3 shows illustrative curves of the second derivative of the drain-source current respective to the gate-source voltage for individual transistors.
Figure 4:
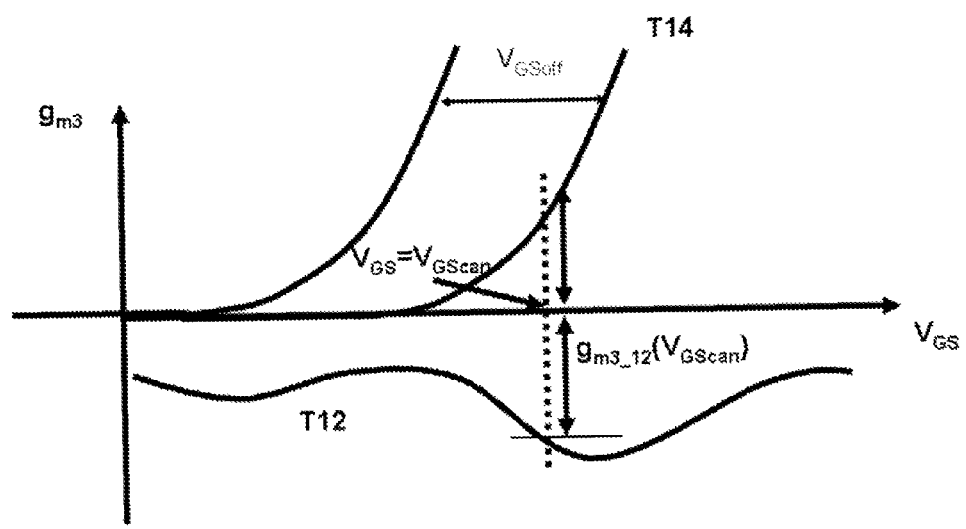
FIG. 4 shows illustrative curves of the third derivative of the drain-source current respective to the gate-source voltage for individual transistors.

FIGS. 3 and 4 illustrate the principle of the cancellation. In FIG. 3, the second derivative curves for T12 and T14 are shown and in FIG. 4, the third derivative curves for T12 and T14 are shown. At the gate bias point $V_{GScan}$, $g_{m2\_12}=g_{m2\_14}$ and $g_{m3\_12}=g_{m3\_14}$. Simultaneous cancellation of the second and third-order nonlinearities is possible when T14 is operating in the exponential sub-threshold region using only one adjustment of $V_{GSoff}$. The $2^{nd}$ derivative $g_{m2\_12}$ in FIG. 3 is a monotonically decreasing function with $V_{GS}$. The ratio $g_{m2\_14}/g_{m3\_14}$ is always $1/m\beta$ and since $g_{m2\_12}$ can vary from zero to any negative values, It is always possible to find a $V_{GS}=V_{GScan}$ value where $g_{m2\_12}/g_{m3\_12}$ is also $1/m\beta$. To get cancellation the $g_{m2}$ curve for T14 is moved horizontally in FIG. 3 with $V_{GSoff}$. When the correct value $V_{GSoff}$ is found, due to the always fixed ratio $g_{m2\_14}/g_{m3\_14}$, It is found that cancellation also occurs for $g_{m3}$ shown in FIG. 4.

There are many advantages to have T14 working at higher current levels when taking other design requirements into account like noise, gain and sensitivity to parameter variations. In one embodiment, T14 is operating in the quasi-exponential threshold region, the region between the exponential sub-threshold region and the quadratic saturated region, where the gate-source voltage is between the upper boundary of the exponential sub-threshold region $V_{GS1}$ and the lower boundary of the quadratic saturated region $V_{GS2}$. $V_{GS1}$ is usually about the transistor threshold voltage, and $V_{GS2}$ is a few tens of a volt above $V_{GS2}$. In this region, the drain-source current can be modeled by an exponential function having a gate voltage dependent ideality factor and drain voltage dependence $F(V_{DS14})$ as in Eq. 16:

$$I_{DS14} = I_{DS0} e^{\beta m(V_{GS14})(V_{GS14} - V_{t14})} * F(V_{DS14}) \qquad \text{Eq. 16}$$

Figure 5:
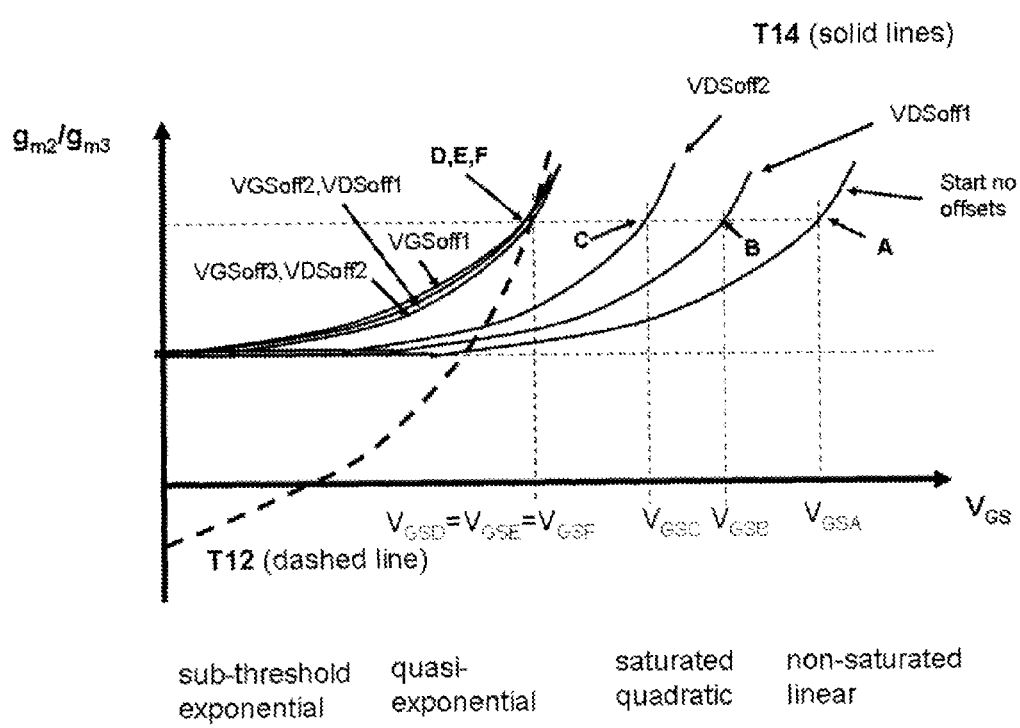
FIG. 5 shows illustrative curves of the ratio of the second derivative to the third derivative of the drain-source current respective to the gate-source voltage for individual transistors.
Figure 6:
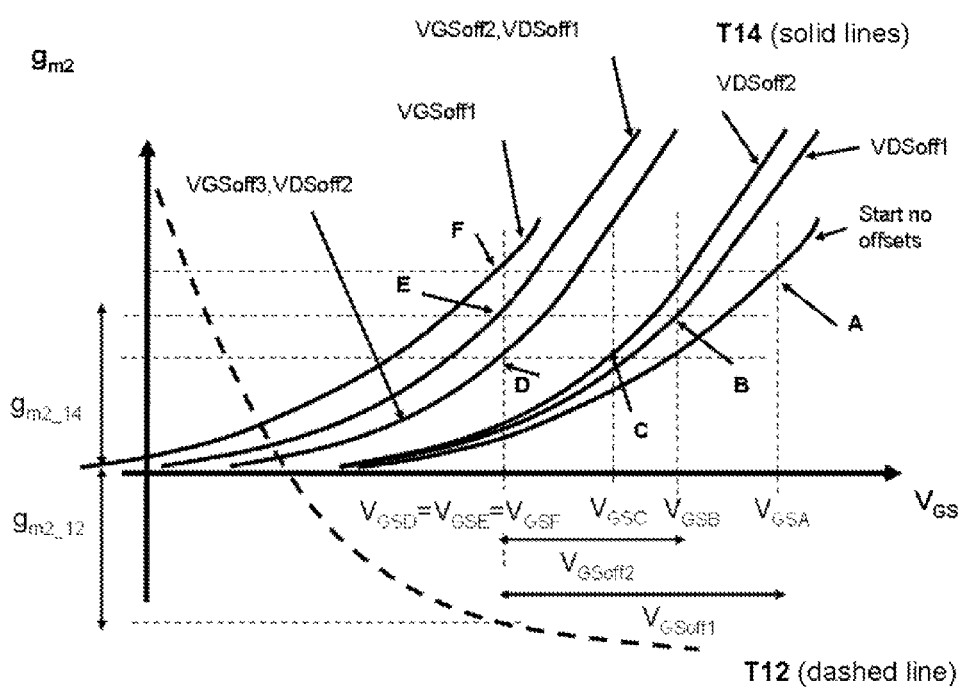
FIG. 6 shows illustrative curves of the second derivative of the drain-source current respective to the gate-source voltage for individual transistors with different gate-source and drain-source offsets.

However, when the transistor is operating in this region the conditions for cancellation are more complex. The drain-source voltage dependence becomes more important. FIGS. 5 and 6 illustrate graphically the existence of cancelling solution. In FIG. 5, $g_{m2}/g_{m3}$-ratio curves for T12 and T14 are shown. The solid lines are the $g_{m2}/g_{m3}$-ratio curves for T14 with different gate-source and drain-source voltage offsets.

From the previous discussion about the exponential case one knows that it is desired to find gate-source voltage where the $g_{m2}/g_{m3}$-ratios for T12 and T14 are equal. Starting at point A with no drain-source voltage offset, in FIG. 5, a gate-source voltage offset $V_{GSoff1}$ is applied for T14 with a value determined by the intersection of the T14 $g_{m2}/g_{m3}$-ratio curve with the $g_{m2}/g_{m3}$-ratio curve for transistor T12 (dashed line). It thus arrives at point F. The corresponding bias point in the $g_{m2}$-curve, shown in FIG. 6, reveals that this shift to point F gives the wrong $g_{m2}$ value, so no cancellation occurs ($g_{m2\_12}+g_{m2\_14} \neq 0$). Then a drain-source voltage offset $V_{DSoff1}$ is applied and this gives another $g_{m2}/g_{m3}$-ratio curve that is monotonic and always above the previous curve. For the same $g_{m2}/g_{m3}$-ratio, this time it starts at point B. The new gate-source voltage offset $V_{GSoff2}$ to make the T14 $g_{m2}/g_{m3}$-ratio curve cross the T12 $g_{m2}/g_{m3}$-ratio curve gives a point E that in this case gives a right $g_{m2}$ value, shown in FIG. 6, such that the cancellation occurs for both $g_{m2}$ and $g_{m3}$, that is $g_{m2\_12}+g_{m2\_14}=0$ and $g_{m3\_12}+g_{m3\_14}=0$. For a larger drain-source offset $V_{DSoff2}$ the same procedure results in a new gate-source offset $V_{GSoff3}$ and a transition from point C to D. From FIG. 6 one can see that no matched $g_{m2}$-values are obtained ($g_{m2_{12}}+g_{m2\_14} \neq 0$).

From this discussion it can be understood that a unique solution also exists in the quasi-exponential region as long as the deviation from this case is small enough that the slopes of the $g_{m2}/g_{m3}$ curves are limited.

Figure 7:
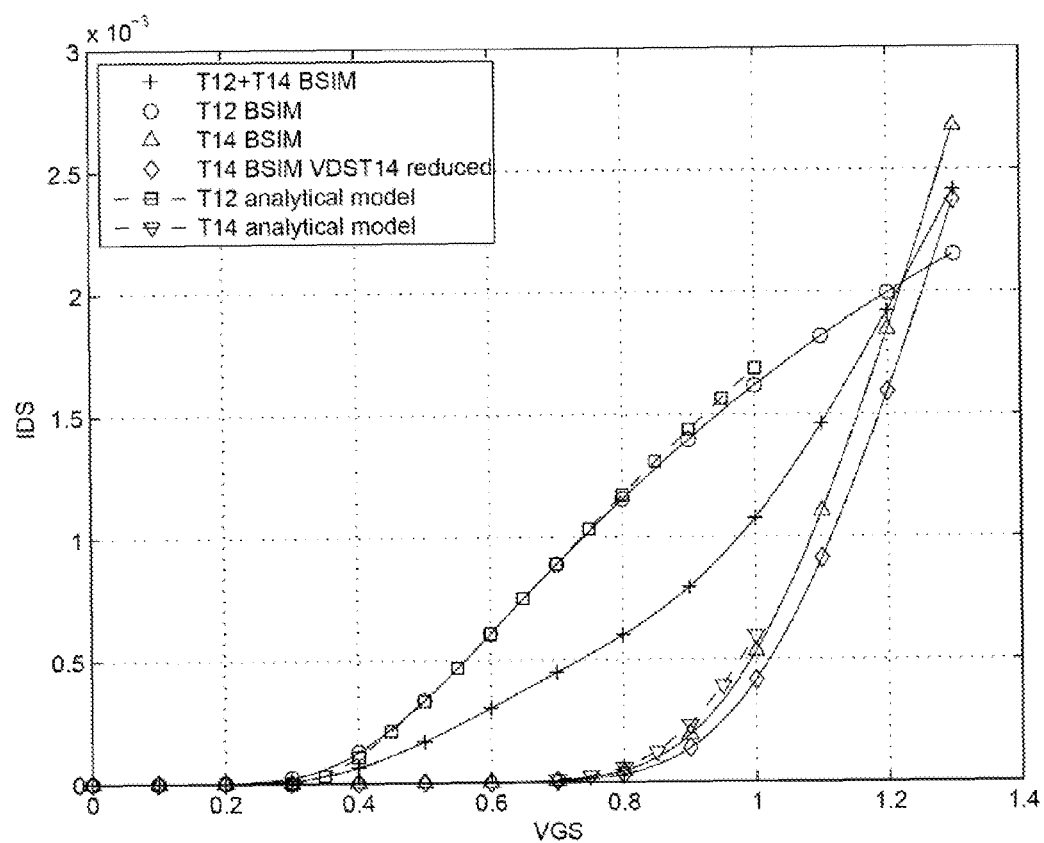
FIG. 7 is a graph of the drain-source current for individual and composite transistors.

For illustrational purposes only, in one embodiment, one can determine the approximate values of parameters $V_0=0.5V$, $V_m=0.9V$ and $m=0.6$ from the DC-characteristics, drain-source current verses gate-source voltage, shown in FIG. 7. The curves in FIG. 7 are obtained by a simulation tool using BSIM model for the transistor operation. The calculation results from the analytical model expressed by Eq.2 and 3 with these approximate values of parameters are also shown in FIG. 7 for comparison. It can be seen that the DC characteristic calculated by the analytical model fit very well with that of the BSIM simulation model for the transistor T12 and T14.

With these parameters' value, cancellation will occur according to Eq. 11 at $V_{GScan}=0.63V$. Thus the bias conditions for the transistor circuit 10 are:
$V_{DS}=0.8V$, $V_{GS}=0.63V$, $V_{DSoff}=-0.5V$, $V_{GSoff}=-0.32V$.
The size of the transistors T12 and T14 are:
length $L_{12}=0.8$ um, width $W_{12}=17$ um and $L_{14}=0.1$ um, $W_{14}=10$ um.
The threshold voltages of the transistors T12 and T14 are:
$V_{t12}=0.3V$, $V_{t14}=0.6V$
For transistor T12, the bias conditions are:
$Vds_{12}=0.8V+\Delta V_{DS}=0.3V$, $Vgs_{12}=0.63V$,
This implies that the transistor T12 operates in the linear non-saturated region.
For transistor T14, the bias conditions are:
$Vds_{14}=0.8V$, $Vgs_{14}=0.63V+\Delta V_{GS}=0.31V$,
This in turn means that the transistor T14 operates in the exponential sub-threshold region.
Of course, for different semiconductor processes, these parameters may have different values.

Figure 8:
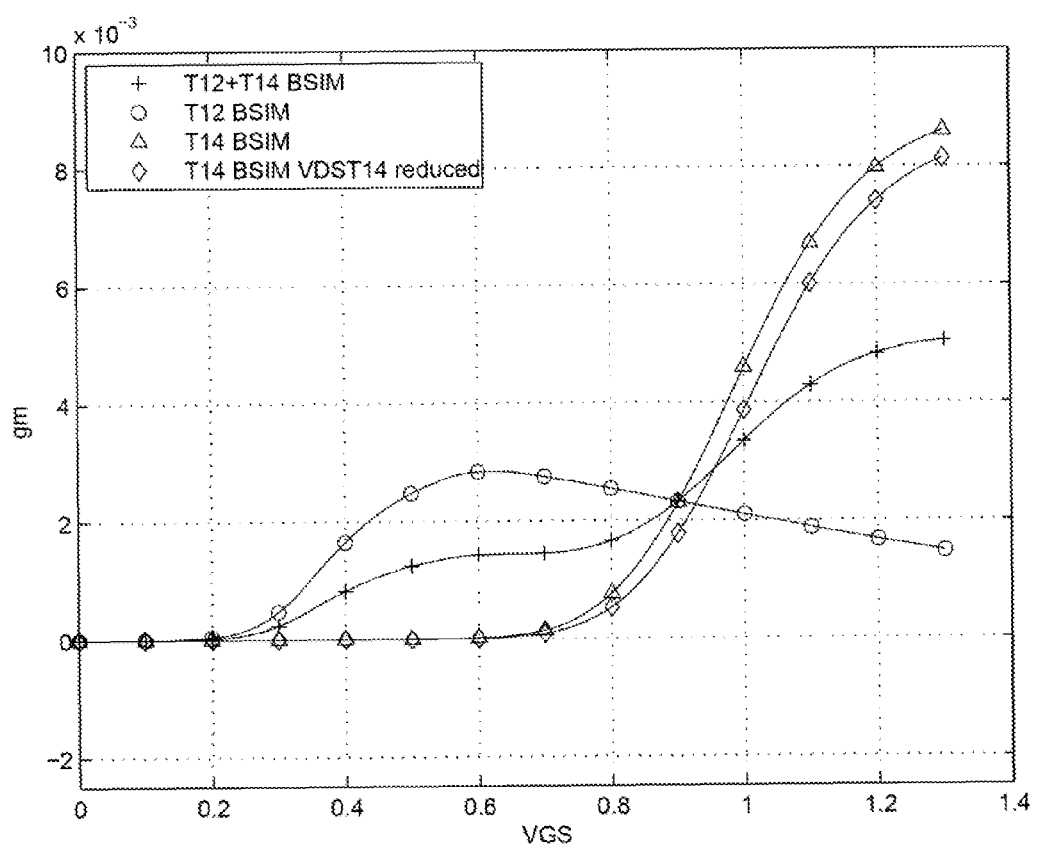
FIG. 8 is a graph of the first derivative curves of the drain-source current for individual and composite transistors.
Figure 9:
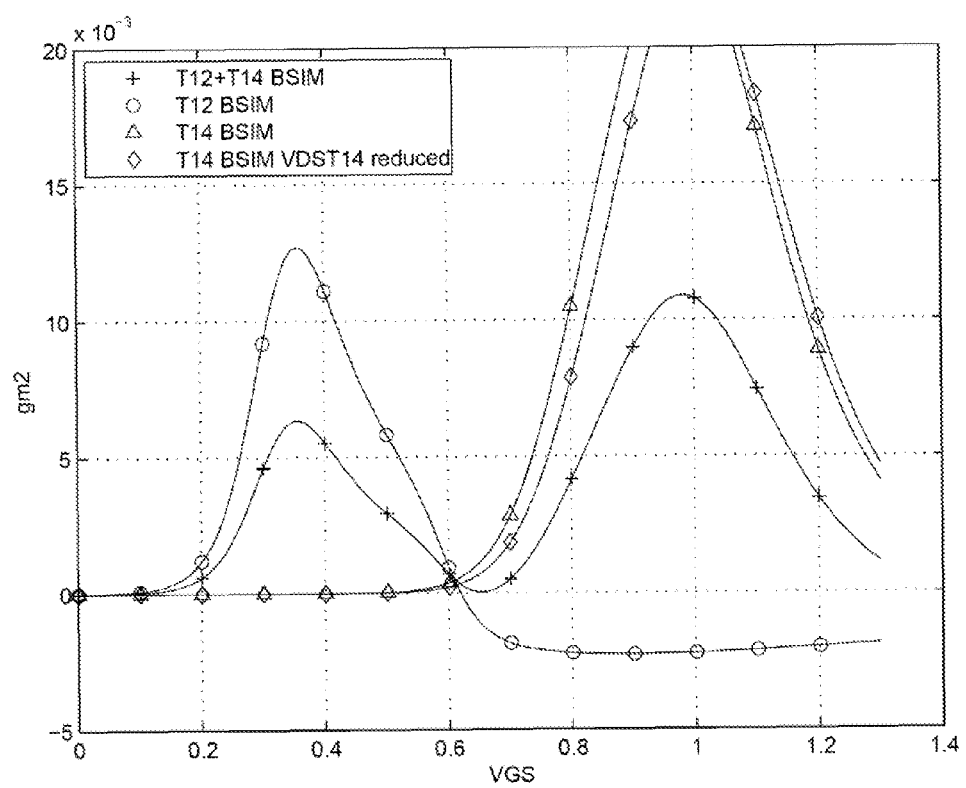
FIG. 9 is a graph of the second derivative curves of the drain-source current for individual and composite transistors.
Figure 10:
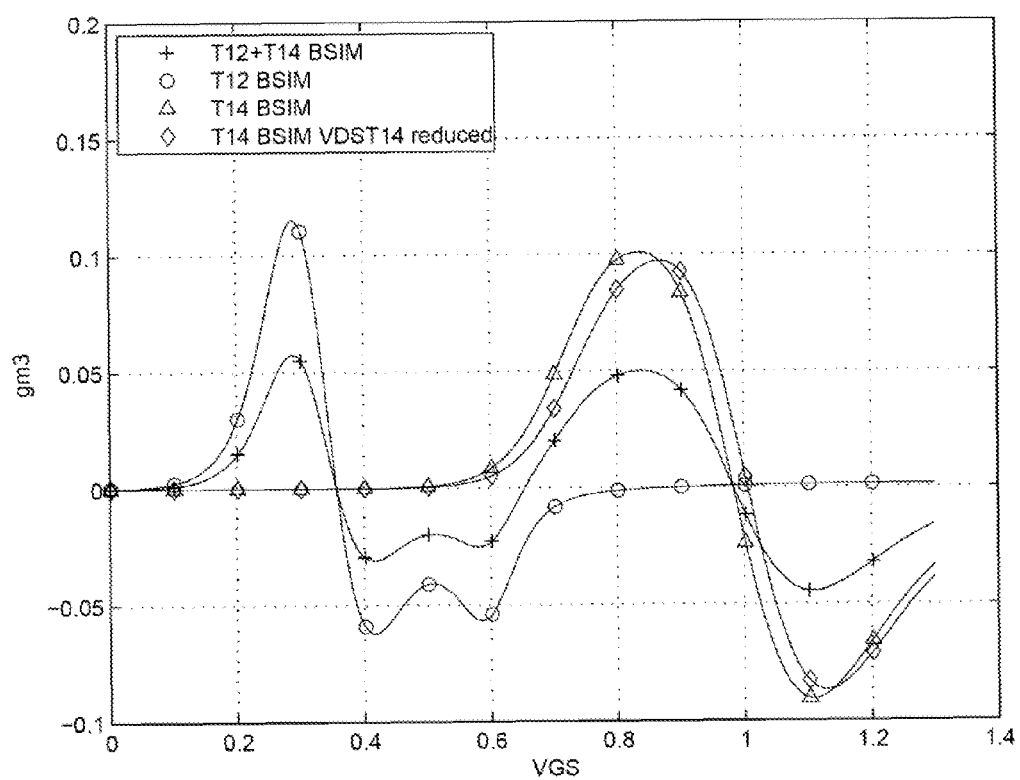
FIG. 10 is a graph of the third derivative curves of the drain current for individual and composite transistors.

FIG. 8 shows simulation results $g_{m1}$ for the transistor circuit 10 and the two transistors T12, T14 respectively. For the transistor circuit 10, $g_{m1}$ increases and flattens out and then starts increasing again with increasing $V_{GS}$. Thus for a gate bias is at or around 0.63V, $g_{m1}$ has a zero slope and an inflection point at the same time so that $g_{m2}$ and $g_{m3}$ are zero at this gate bias range. FIGS. 9 and 10 show simulation results $g_{m2}$ and $g_{m3}$ for the transistor circuit 10 and each of the transistors T12 and T14. One may note that, for a gate bias being at or around 0.63V, the $g_{m2}$ values for the transistors T12 and T14 have opposite signs, which results in that the combined $g_{m2}$ for the transistor circuit 10 is zero. For the same gate bias range (around 0.63V), the $g_{m3}$ values of the transistor circuit 10 can also achieve zero value or closer to zero value compare to each transistor used alone. In this way, the second and third-order nonlinearities are cancelled or reduced simultaneously for the transistor circuit 10.

Figure 11:
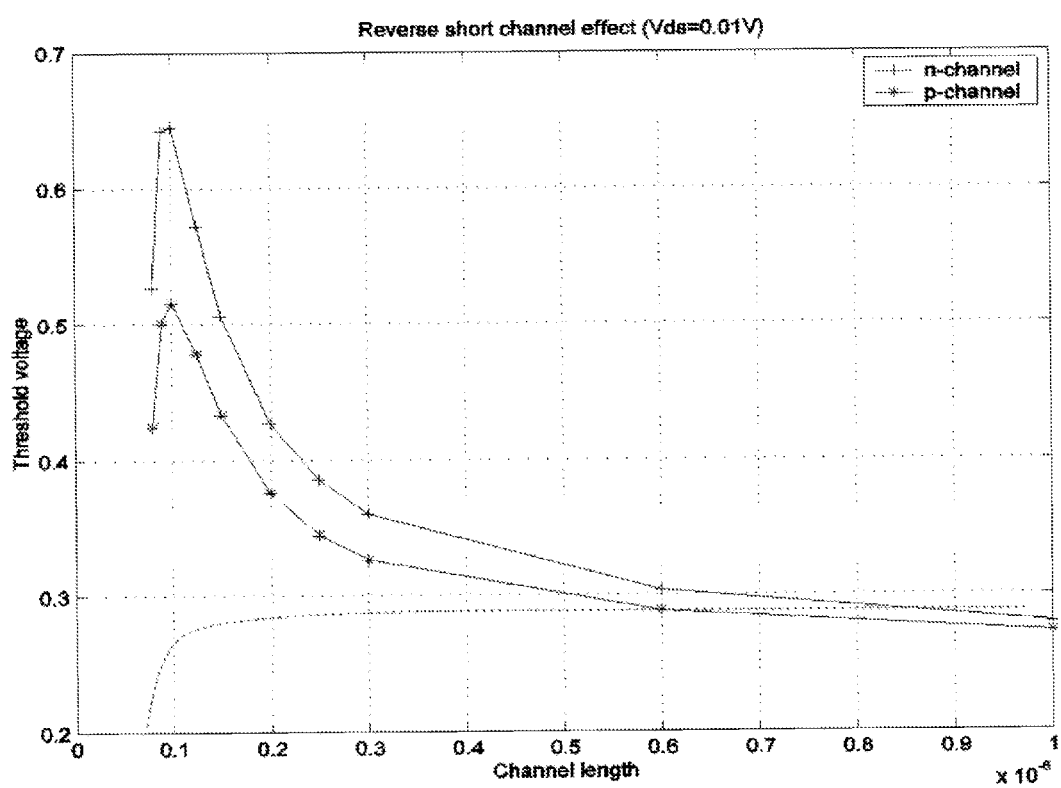
FIG. 11 is a graph of exemplary transistor threshold voltage curves.
Figure 12:
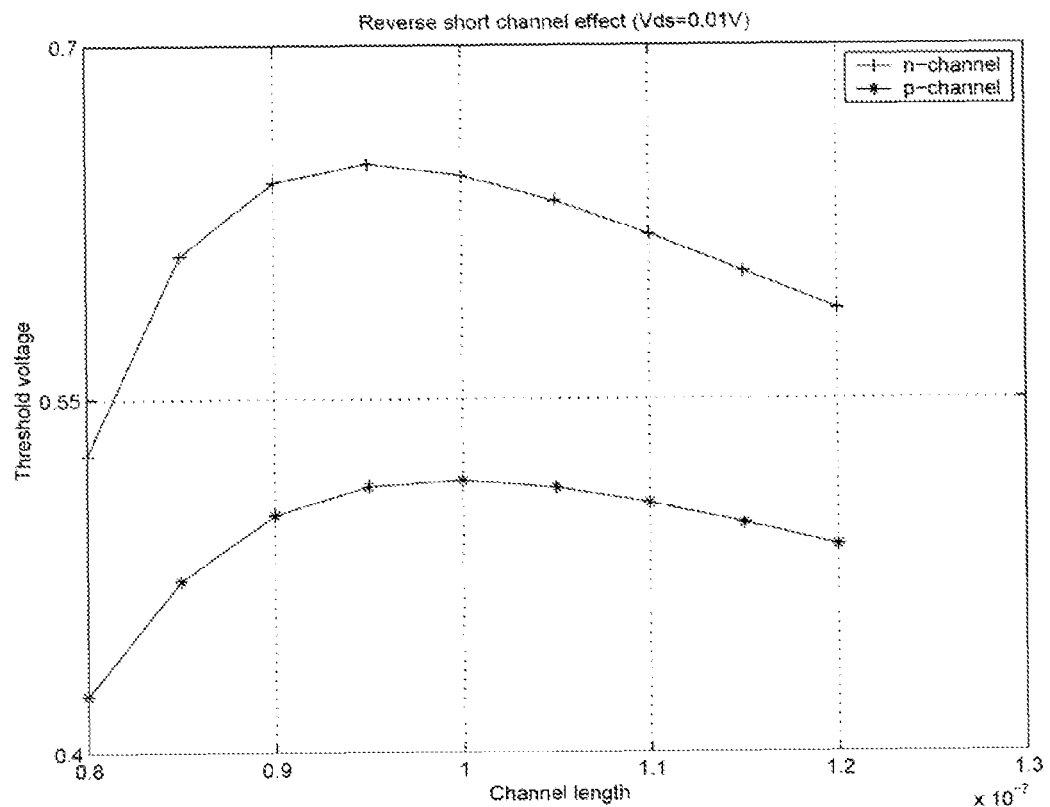
FIG. 12 is a graph of threshold voltage peaks arising from reverse short channel effects for one embodiment of N-channel and P-channel transistors.

It may be noted that the transistor T14 has a much higher threshold voltage than the transistor T12. This is because the channel length of the transistor T14 is selected such that a reverse short channel effects (RSCE) occurs. FIG. 11 illustrates the reverse short channel effects for a given process technology, such as deep submicron MOS transistors implemented at 0.1 micron channel lengths or less. As seen from FIG. 11, the threshold voltage increases as the channel length reduces towards the minimum channel length, but then begins decreasing at or around the minimum channel length. This RSCE behavior thus results in a peak (maximum) threshold at or around the minimum channel length. Furthermore, by tailoring the semiconductor process, the RSCE behavior can exhibit a relatively broad threshold voltage peak. With a broad peak, slight variations in the transistor channel length arising from process fabrication tolerances will not cause significant deviations in the threshold voltage of the transistor 14, whose channel length is targeted to be at or about the length corresponding to the nominal threshold voltage peak. FIG. 12 illustrates a magnified view of the threshold voltage peaks for the N- and P-channel device curves given in FIG. 11, and exhibits the desired broad peak behavior.

Of course the channel length of the transistors T12 and T14 can be chosen arbitrarily as long as the required operating conditions are fulfilled. Preferably, the channel length is chosen so that slight variations in the semiconductor process will not cause large threshold voltage variations. For example, the channel length of the transistor T12 may be chosen between 0.4 μm and 1 μm and the channel length of the transistor T14 may be chosen at or about 0.1 μm as discussed above.

Figure 13:
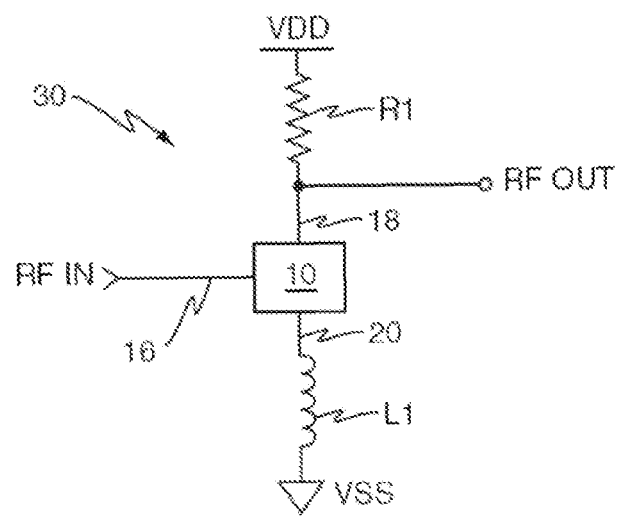
FIG. 13 is a block diagram of one embodiment of a low-noise amplifier circuit.

The improved linearity and good manufacturability of the transistor circuit 10 make it an ideal building block in a wide range of circuit applications, including a wide range of radiofrequency communication circuits. By way of non-limiting example, FIG. 13 illustrates a radiofrequency low-noise amplifier circuit 30 comprising an embodiment of the transistor circuit 10. In operation, a radiofrequency (RF) input signal RF IN drives the gate connection 16, while the drain connection 18 is coupled to a supply voltage rail VDD through a drain load resistor R1, and thereby provides a radiofrequency output signal RF OUT. Finally, the source connection 20 is coupled to a reference voltage, e.g., VSS, through an emitter degeneration inductor L1, which provides impedance matching for the RF IN driving circuit.

Figure 14:
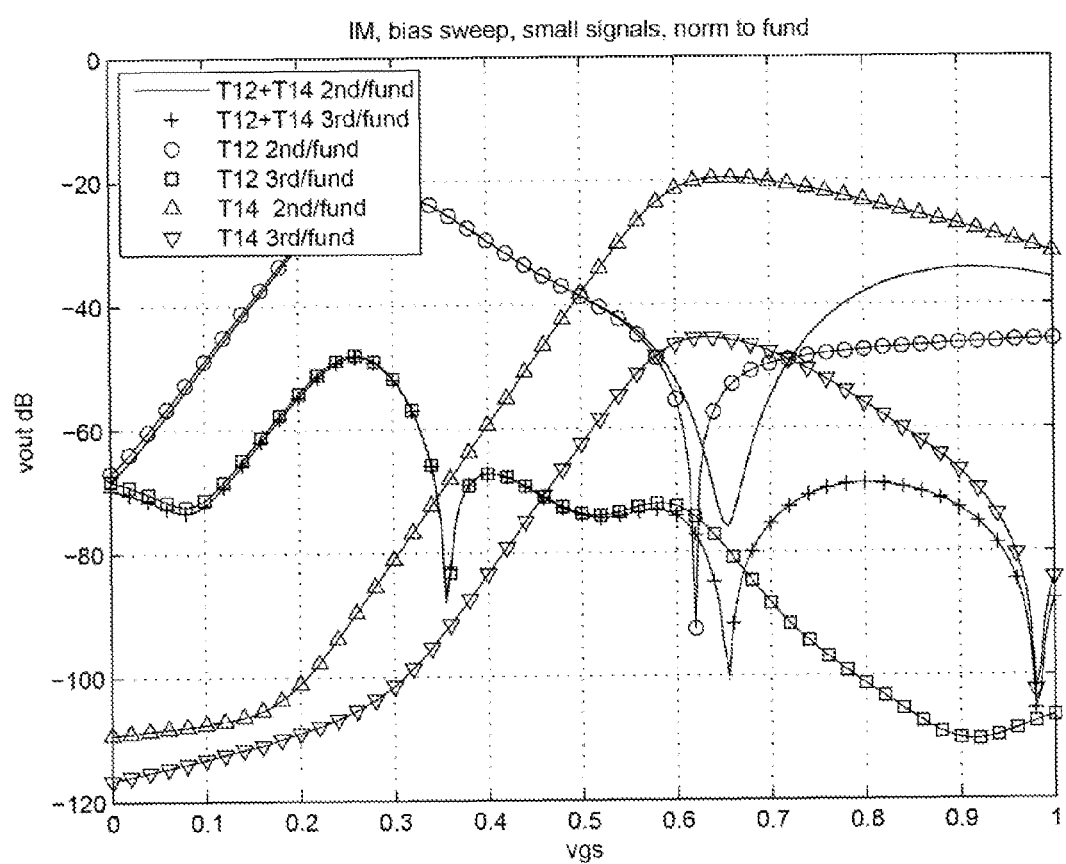
FIG. 14 is a graph illustrating behaviors of individual and composite transistors used in the low-noise amplifier shown in FIG. 13.

FIG. 14 provides further behavioral illustration of the transistor circuit 10 used in the low-noise amplifier circuit 30. An RF signal consisting of two tones with frequencies f1=1 GHz and f2=1.01 GHz is provided at the RF IN terminal. The output signal at the RF OUT terminal has different components with different frequencies, such as the fundamental component with frequencies f1 and f2, the second-order nonlinear component with frequencies f1−f2 and f2+f1, as well as the third-order nonlinear component with frequencies 2f1−f2 and 2f2−f1. Amplitudes (in dB) of the second and third-order components (normalized to the amplitude of the fundamental component) versus the gate bias are shown in FIG. 14. For comparison, amplitudes of the second and third-order components (also normalized to the amplitude of the fundamental component) versus the gate bias are also shown for the transistors T12 and T14 when used alone in the low-noise amplifier circuit 30. It may be seen how a single transistor alone can only cancel or at least reduce the second and third-order components at different gate-source voltages whereas the transistor circuit 10 can cancel or at least reduce both the second and third-order nonlinear components simultaneously at one gate-source voltage. This is illustrated by the fact that at a point where the gate-source voltage is around 0.63V, there is a dip for both the second and third-order nonlinear components.

Of course, the transistor circuit 10 has applicability in a wide range of circuits and devices. For example, the transistor circuit 10 can be included in an RF mixer, within a radiofrequency power amplifier or any type of low noise amplifier etc. Further the transistor circuit 10 can be included in a wireless transceiver.

The particular embodiments described above are merely illustrative and should not be considered restrictive in any way. Although the discussion above is for cancellation of the second and third-order nonlinearities simultaneously in the transistor circuit 10, this circuit can also be used to only cancel the second-order nonlinearity or third-order nonlinearities alone. Here the term "cancellation" should not be understood in a sense of "perfect cancellation", it should be understood as "substantial cancellation" or "reduction" etc. The scope of the invention is determined by the following claims, and all variations and equivalents that fall within the range of the claims are intended to be embraced therein.

The invention claimed is:

1. An electronic circuit operable to substantially cancel simultaneously second and third-order nonlinearities thereof, comprising:
    at least two transistors coupled in parallel;
    a biasing circuit supplying a first gate-source voltage and a first drain-source voltage to the first transistor and a second gate-source voltage and a second drain-source voltage to the second transistor;
    wherein the first gate-source voltage and the second gate-source voltage are offset from each other by a gate-source voltage offset; the first drain-source voltage and the second drain-source voltage are offset from each other by a drain-source voltage offset;
    further wherein the electronic circuit is implemented in a Metal Oxide Semiconductor (MOS), process, wherein threshold voltages of the first and second transistors are a function of a transistor channel length; and
    further wherein the second transistor channel length is configured such that the threshold voltage of the second transistor is at a peak on a threshold voltages versus channel lengths curve arising from reverse short channel effects for a given semiconductor process.

2. The electronic circuit of claim 1, wherein the biasing circuit is configured to supply the first gate-source voltage to the first transistor such that a ratio of a second derivative and third derivative of a drain-source current of the first transistor with respect to the first gate-source voltage is equal to or about 1/mβ, wherein m is an ideality factor of an exponential function of a drain-source current of the second transistor and β is an inverse of a thermal voltage; and offset the second gate-source voltage from the first gate-source voltage such that a second derivative of the drain-source current of the second transistor with respect to the second gate-source voltage is equal or substantially equal to the second derivative of the drain-source current of the first transistor with respect to the first gate-source voltage.

3. The electronic circuit of claim 1, wherein the biasing circuit is configured to offset the first gate-source voltage and the second gate-source voltage from each other and offset the first drain-source and the second drain-source voltage from each other such that a ratio of a second derivative and third derivative of a drain-source current of the first transistor with respect to the first gate-source voltage is about equal to a ratio of a second derivative and third derivative of a drain-source current of the second transistor with respect to the second gate-source voltage.

4. The electronic circuit of claim 1, wherein the first transistor comprises more than one integrated circuit transistor element configured with a first transistor channel length, and the second transistor comprises more than one integrated circuit transistor element configured with a second transistor channel length.

5. The electronic circuit of claim 1, wherein the threshold voltage of the second transistor is greater than the threshold voltage of the first transistor.

6. The electronic circuit of claim 4, wherein the second transistor channel length is at or about 0.1 μm and the first transistor channel length is greater than 0.4 μm.

7. The electronic circuit of claim 1, as implemented in a radiofrequency mixer circuit.

8. The electronic circuit of claim 1, as implemented in a radiofrequency low-noise amplifier circuit.

9. The electronic circuit of claim 1, as implemented in a radiofrequency power amplifier circuit.

10. The electronic circuit of claim 1, as implemented in a wireless transceiver.

11. A method of simultaneously cancel second and third-order nonlinearities in a transistor circuit comprising:
  coupling in parallel at least two transistors to form a transistor circuit;
  biasing the first transistor with a first gate-source voltage and a first drain-source voltage;
  biasing the second transistor with a second gate-source voltage and a second drain-source voltage;
  offsetting the first gate-source voltage and the second gate-source voltage from each other by a gate-source voltage offset;
  offsetting the first drain-source voltage and the second drain-source voltage from each other by a drain-source voltage offset; and
  implementing the transistor circuit in a Metal Oxide Semiconductor (MOS) process, wherein threshold voltages of the first and second transistors are a function of a transistor channel length; and
  configuring the second transistor channel length such that the threshold voltage of the second transistor is at a peak on a threshold voltages versus channel lengths curve arising from reverse short channel effects for a given semiconductor process.

12. The method of claim 11, wherein the gate-source voltage offset and the drain-source voltage offset are determined such that a ratio of a second derivative and third derivative of a drain-source current of the first transistor with respect to the first gate-source voltage is equal to or about $1/m\beta$, wherein m is an ideality factor of an exponential function of a drain-source current of the second transistor and $\beta$ is an inverse of a thermal voltage; and wherein a second derivative of the drain-source current of the second transistor with respect to the second gate-source voltage is equal or substantially equal to the second derivative of the drain-source current of the first transistor with respect to the first gate-source voltage.

13. The method of claim 11, wherein the gate-source voltage offset and the drain-source voltage offset are determined such that a ratio of a second derivative and third derivative of a drain-source current of the first transistor with respect to the first gate-source voltage is about equal to a ratio of a second derivative and third derivative of a drain-source current of the second transistor with respect to the second gate-source voltage.

* * * * *

UNITED STATES PATENT AND TRADEMARK OFFICE
CERTIFICATE OF CORRECTION

PATENT NO. : 8,183,918 B2
APPLICATION NO. : 12/594655
DATED : May 22, 2012
INVENTOR(S) : Arnborg It is certified that error appears in the above-identified patent and that said Letters Patent is hereby corrected as shown below:

In the Specifications

In Column 5, Line 63, in Eq. 4, delete "$m\beta I_{DS0\_14} e^{m\mu}$" and insert -- $m\beta I_{DS0\_14} e^{m\beta}$ --, therefor.

In Column 7, Line 18, delete "It is" and insert -- it is --, therefor.

In Column 7, Line 22, delete "It is" and insert -- it is --, therefor.

In Column 8, Line 3, delete "$(g_{m2\_12})$" and insert -- $(g_{m2\_12}$ --, therefor.

In the Claims

In Column 12, Line 10, in Claim 12, delete "limp," and insert -- 1/mβ, --, therefor.

Signed and Sealed this
Eleventh Day of June, 2013

Teresa Stanek Rea
*Acting Director of the United States Patent and Trademark Office*